United States Patent
Whetsel

(10) Patent No.: US 8,826,091 B2
(45) Date of Patent: Sep. 2, 2014

(54) DIE WITH DIO PATH, CLOCK INPUT, TLM, AND TAP DOMAINS

(75) Inventor: Lee D. Whetsel, Parker, TX (US)

(73) Assignee: Texas Instruments Incorporated, Dallas, TX (US)

(*) Notice: Subject to any disclaimer, the term of this patent is extended or adjusted under 35 U.S.C. 154(b) by 550 days.

(21) Appl. No.: 13/175,484

(22) Filed: Jul. 1, 2011

(65) Prior Publication Data

US 2011/0258502 A1  Oct. 20, 2011

Related U.S. Application Data

(62) Division of application No. 13/023,237, filed on Feb. 8, 2011, now Pat. No. 8,015,463, which is a division of application No. 12/849,191, filed on Aug. 3, 2010, now Pat. No. 7,904,774, which is a division of application No. 12/493,926, filed on Jun. 29, 2009, now Pat. No. 7,797,602, which is a division of application No. 12/175,655, filed on Jul. 18, 2008, now Pat. No. 7,571,365, which is a division of application No. 11/565,979, filed on Dec. 1, 2006, now Pat. No. 7,417,450.

(60) Provisional application No. 60/741,927, filed on Dec. 2, 2005.

(51) Int. Cl.
*G01R 31/28* (2006.01)
*G01R 31/3185* (2006.01)

(52) U.S. Cl.
CPC *G01R 31/318558* (2013.01); *G01R 31/318563* (2013.01); *G01R 31/318544* (2013.01)

USPC .......................... 714/734; 714/727; 714/729

(58) Field of Classification Search
USPC ................. 714/724, 726, 727, 729, 733, 734
See application file for complete search history.

(56) References Cited

U.S. PATENT DOCUMENTS

| | | | | |
|---|---|---|---|---|
| 6,430,718 | B1 * | 8/2002 | Nayak | 714/727 |
| 6,516,442 | B1 * | 2/2003 | Wang et al. | 714/776 |
| 6,597,198 | B2 * | 7/2003 | Haycock et al. | 326/82 |
| 6,631,504 | B2 * | 10/2003 | Dervisoglu et al. | 716/136 |
| 6,653,957 | B1 * | 11/2003 | Patterson et al. | 341/100 |
| 6,988,232 | B2 * | 1/2006 | Ricchetti et al. | 714/736 |

OTHER PUBLICATIONS

"Synchronizing the IEEE 1149.1 test access port for chip level testability" by Bhavsar, This paper appears in: Design & Test of Computers, IEEE Publication Date: Apr.-Jun. 2000 vol. 17, Issue: 2 on pp. 94-99 ISSN: 0740-7475 INSPEC Accession No. 6611672.*
IEEE Standard for Reduced-Pin and Enhanced-Functionality Test Access Port and Boundary-Scan Architecture, IEEE Std 1149.7-2009 , vol., no., pp. c1,985, Feb. 10, 2010.*

* cited by examiner

*Primary Examiner* — Cynthia Britt
(74) *Attorney, Agent, or Firm* — Lawrence J. Bassuk; Frederick J. Telecky, Jr.

(57) ABSTRACT

Testing of die on wafer is achieved by; (1) providing a tester with the capability of externally communicating JTAG test signals using simultaneously bidirectional transceiver circuitry, (2) providing die on wafer with the capability of externally communicating JTAG test signals using simultaneously bidirectional transceiver circuitry, and (3) providing a connectivity mechanism between the bidirectional transceiver circuitry's of the tester and a selected group or all of the die on wafer for communication of the JTAG signals.

3 Claims, 11 Drawing Sheets

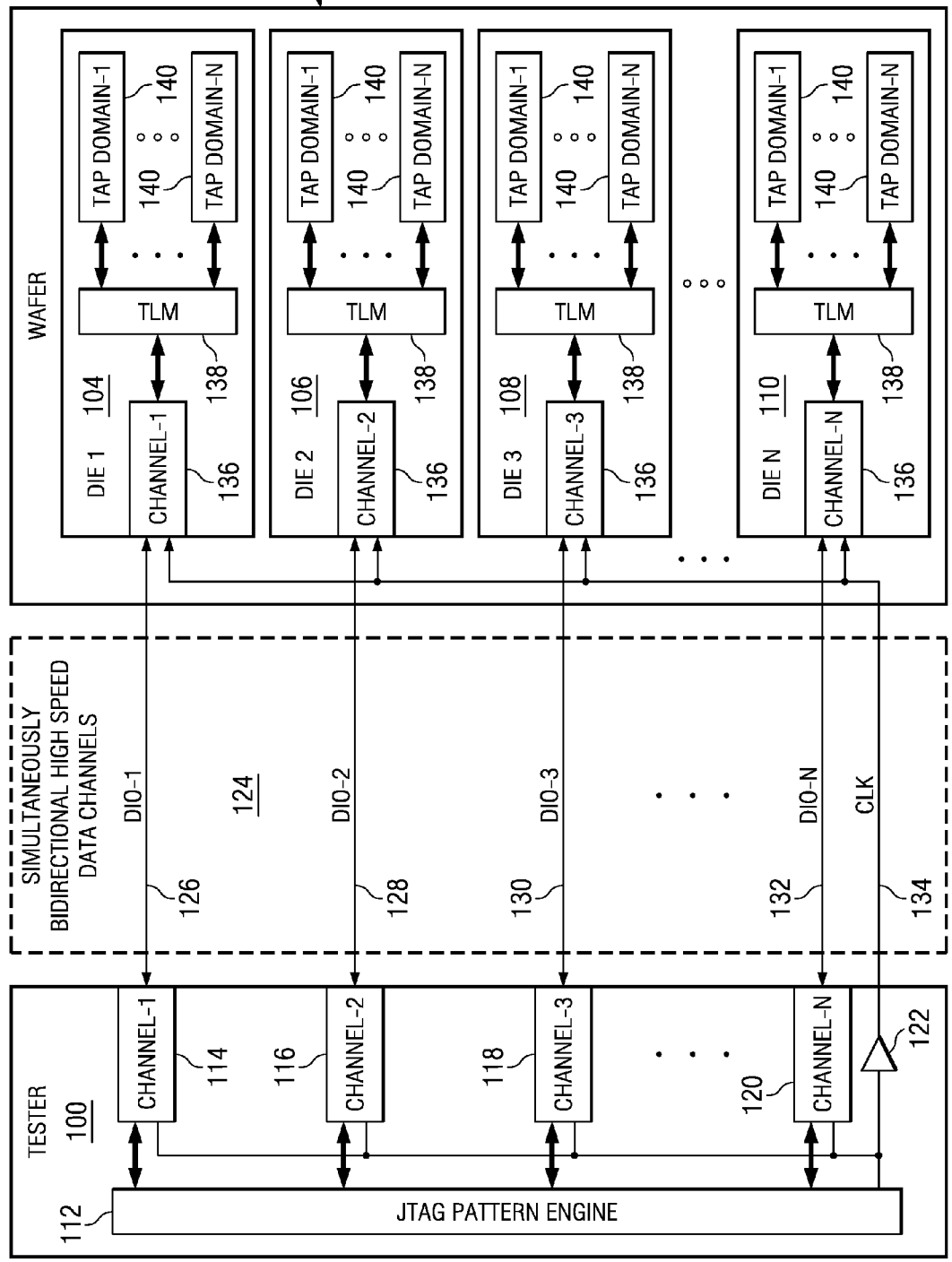

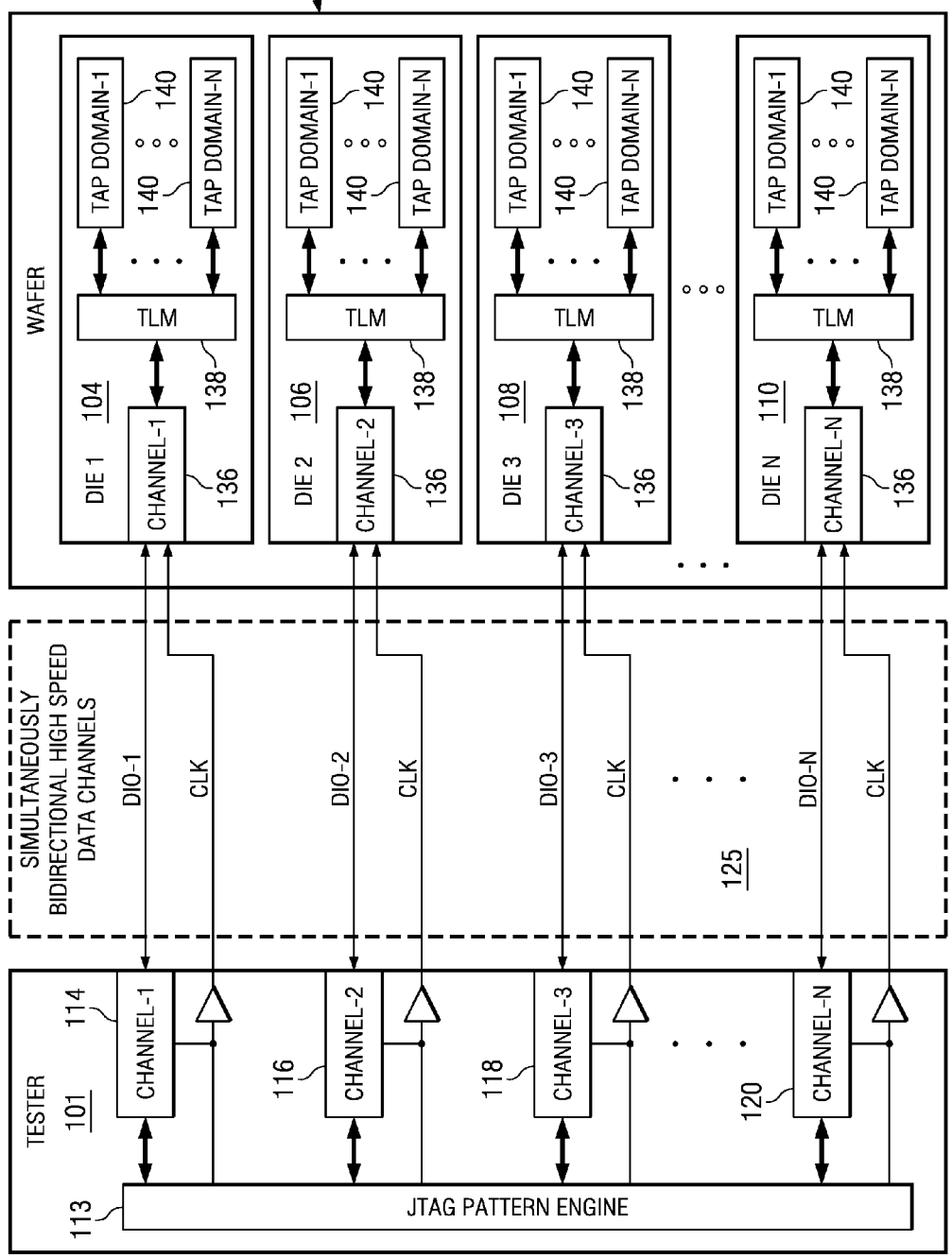

DIE WITH DIO PATH, CLOCK INPUT, TLM, AND TAP DOMAINS

CROSS REFERENCE TO RELATED APPLICATIONS

This application is a divisional of prior application Ser. No. 13/023,237, filed Feb. 8, 2011, now U.S. Pat. No. 8,015,463, issued Sep. 6, 2011;

Which is a divisional of prior application Ser. No. 12/849,191, filed Aug. 3, 2010, now U.S. Pat. No. 7,904,774, granted Mar. 8, 2011; which is a divisional of prior application Ser. No. 12/493,926, filed Jun. 29, 2009, now U.S. Pat. No. 7,797,602, granted Sep. 14, 2010; which is a divisional of prior application Ser. No. 12/175,655, filed Jul. 18, 2008, now U.S. Pat. No. 7,571,365, granted Aug. 4, 2009; which is a divisional of prior application Ser. No. 11/565,979, filed Dec. 1, 2006, now U.S. Pat. No. 7,417,450, granted Aug. 26, 2008; which claims priority from Provisional Application No. 60/741,927, filed Dec. 2, 2005.

The following patent application publication includes subject matter which is related to the subject matter of this application. The patent application publication has been assigned to the assignee of this application, and is incorporated herein by reference. US Patent Application Publication, Pub. No. US 2006/0,236,174 A1.

The disclosure of this application also relates to U.S. Pat. No. 6,073,254, "Selectively accessing test access ports in a multiple test access port environment."

The disclosure of this application also relates to U.S. Pat. No. 6,242,269, "Parallel scan distributors and collectors and process of testing integrated circuits."

The disclosure of this application also relates to U.S. Pat. No. 6,543,020, "Test pattern compression for an integrated circuit test environment".

BACKGROUND OF THE DISCLOSURE

1. Field of the Disclosure

The present disclosure relates generally to testing die on wafer and, more particularly, to testing of die on wafer using a reduced pin count JTAG interface. The reduced JTAG interface enables a larger number of die on wafer to be contacted by low cost testers and tested, which results in lowering the cost of manufacturing integrated circuits.

2. Description of Related Art

Today more and more wafer testing is being performed by low cost wafer testers. Low cost wafer testers are achieved primarily in two ways. (1) Decreasing the number of test contacts, and therefore expensive tester interfacing circuitry and probing mechanisms, between the tester and die on wafer, and (2) including more design for test circuitry (i.e. built in self test circuitry, scan design circuitry, test data compression/decompression circuitry) in the die to reduce the amount of test circuitry required in the tester. Furthermore wafer test cost can be reduced by using standardized design for test interfaces and circuitry in the die, such as the IEEE 1149.1 (JTAG) interface. The IEEE 1149.1 serial interface allows die on wafer to be tested via a standard 5 wire interface consisting of a test data input (TDI), a test data output (TDO), a test clock (TCK), a test mode select (TMS), and a test reset (TRST) signal. Using this interface, the tester only needs to contact each die using these 5 test signals to input and output test data and instructions. While the IEEE 1149.1 interface can be used for wafer testing, it still requires 5 contacts per die on wafer. For example, if 500 die on wafer are to be tested in parallel, the tester would have to have 2500 contacts to the wafer (500 die ×5 signals each). Additionally, the IEEE 1149.1 serial interface bandwidth is relatively low since the TCK signal that times the interface typically operates at a frequency of only 20 to 50 MHz.

SUMMARY OF THE DISCLOSURE

The present disclosure provides a high speed, two signal test interface between a tester and a selected group or all of the die on wafer. The test interface operates to communicate IEEE 1149.1 signals between the tester and die at high speeds through the use of simultaneously bidirectional transceiver (SBT) technology.

DESCRIPTION OF THE VIEWS OF THE DISCLOSURE

FIG. 1A illustrates a first example of a tester contacting and communicating test data to die on wafer using the test interface of the present disclosure.

FIG. 1B illustrates a second example of a tester contacting and communicating test data to die on wafer using the test interface of the present disclosure.

DETAILED DESCRIPTION OF THE DISCLOSURE

Figure 2A:
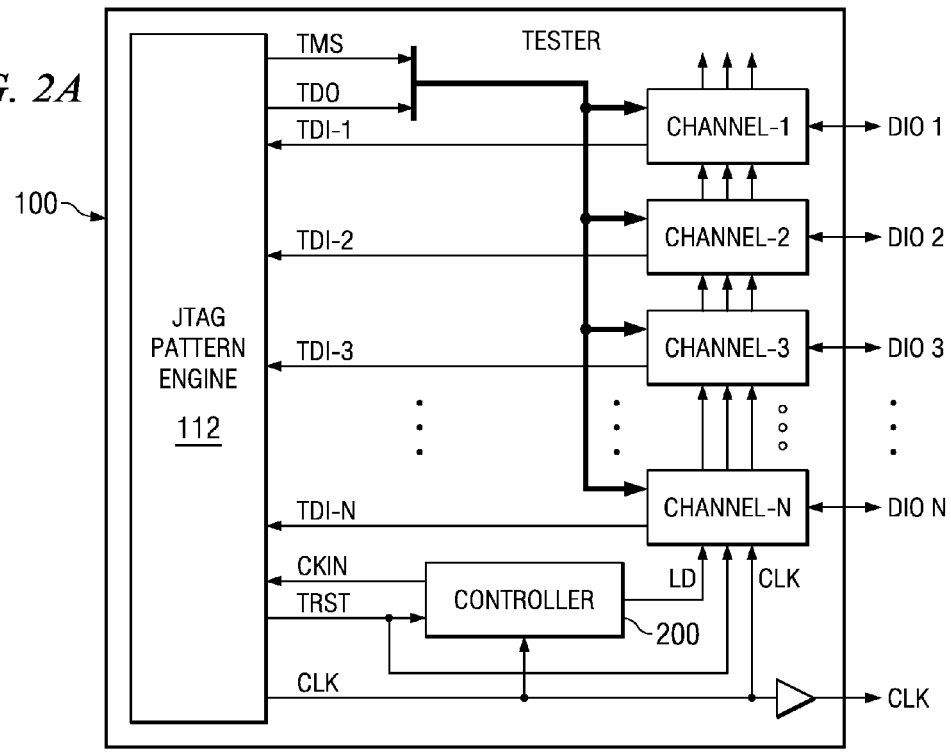
FIG. 2A illustrates an example of the tester's test interface circuitry of FIG. 1A whereby one controller is used to control all the tester interface channels.

FIG. 1A illustrates an example of a tester 100 coupled to die 104-110 on a wafer 102 via a connectivity mechanism 124. The die 104-110 could be a selected group of die on the wafer or all of the die on wafer. The connectivity mechanism can be any type of connection scheme that allows signals to flow between the tester and wafer. While not shown, the tester also supplies power and ground signals to the die on wafer to power up the die. The tester consists of a JTAG Pattern Engine 112 and test channels 114-120. The JTAG Pattern engine 112 consists of circuitry designed to communicate JTAG test patterns between the tester and wafer. The test channels receive the JTAG output test patterns (TMS and TDO) from the JTAG Pattern Engine and output them as serialized 2-bit packets on the Data I/O (DIO) paths 126-132 to each die on the wafer. The test channels are simultaneously bidirectional which allows them to simultaneously input JTAG test data inputs (TDI) from each die and input the test data input to the JTAG Pattern Engine, while, at the same time, the JTAG Pattern Engine outputs JTAG test patterns to the die. The test data transferred between the tester and wafer via the DIOs 126-132 is timed by a clock signal (CLK) 134 which is provided by the tester.

Each die 104-110 of wafer 102 includes a test channel 136, a Tap Linking Module (TLM) 1138, and TAP domains 140. The test channels 136 serve to receive the serialized JTAG test data pattern (TMS and TDO packets) from the tester, via the DIOs, and convert the serialized JTAG test data pattern into a parallel JTAG test data pattern (TMS and TDI) which is input to the TLM. The TLM is a circuit used to select one or more of the TAP domains 140 to be coupled for access by the tester. The TLM circuitry can be implemented in a number of ways, including the implementation described in U.S. Pat. No. 6,073,254 which is incorporated herein by reference. The test channels 136 are simultaneously bidirectional which allows them to output JTAG test data output (TDO) from a selected TAP domain(s) to the tester simultaneously with the input of the JTAG test data pattern (TMS and TDO) from the tester via the DIOs 126-132.

FIG. 1B illustrates another example of a tester 101 coupled to die 104-110 of wafer 102 via a connectivity mechanism 125. The tester 101 differs from the tester 100 of FIG. 1A in that each test channel 114-120 is driven by a separate clock (CLK) from the JTAG Pattern Engine 113 instead of a common clock (CLK) as shown in FIG. 1A. The advantages of using separate CLKs to drive the test channels include but are not limited to; (1) the transfer of test data between the tester channels and die channels can occur at the same or different frequencies, (2) different tests can be performed on each die, (3) each die test can be scheduled to occur at different times, and (4) each die test can be started, paused, or stopped at different times. All these advantages can effectively be used to reduce the heat generated on the wafer during the testing of a large number of die, which can be a major concern during wafer testing.

FIG. 2A illustrates a more detail example of the tester 100 of FIG. 1A. As seen the JTAG Pattern Engine outputs JTAG TMS and TDO signals to each test channel 1-N, and inputs TDI data from each test channel 1-N. A controller 200 receives the CLK and TRST outputs from the JTAG Pattern Engine, and outputs a load (LD) signal to the test channels and a CKIN signal to the JTAG Pattern Engine. The LD signal is used to cause the test channels to load the parallel TMS and TDO data output from the JTAG Pattern Engine which is shifted out of the test channel onto the DIO1-N signals. The CKIN signal output from the controller times the operation of the JTAG test pattern control circuitry within the JTAG Pattern Engine. The TRST signal is used to initialize the controller 200. The TRST signal is also input to the test channels for initializing them as well.

Figure 2B:
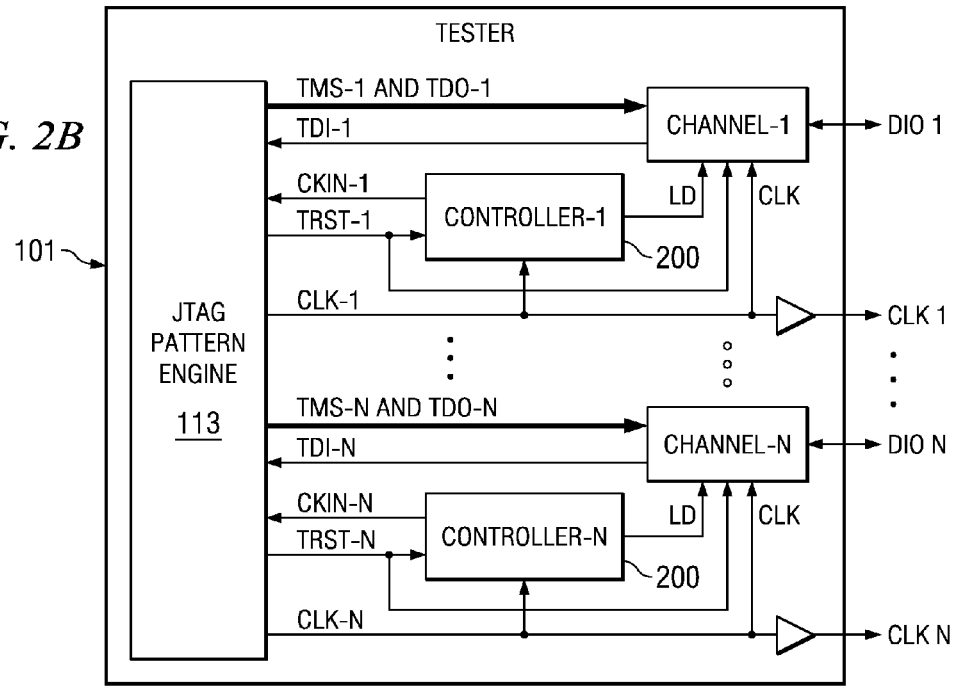
FIG. 2B illustrates an example of the tester's test interface circuitry of FIG. 1B whereby each tester interface channel has its own controller.

FIG. 2B illustrates a more detail example of the tester 101 of FIG. 2B. As seen, each test channel 1-N has its own controller circuit 200 which operates in response to a unique CLK output from the JTAG Pattern Engine 113 to generate the previously mentioned LD and CKIN signals. The JTAG Pattern Engine of FIG. 2B has separate JTAG test pattern control circuitry which is interfaced to each of the test channels and controller combinations via separate TMS, TDO, CKIN, TRST, and CLK signals. Each JTAG test pattern control circuitry in the JTAG Pattern Engine is timed by the CKIN signal output from a channel controller 200. In response to the CKIN signal, each the JTAG test control circuitry outputs TMS and TDO to the associated test channel and receives, during JTAG DR or IR Shift operations, TDI input from the associated test channel. The controller 200 of each test channel is timed by a separate CLK output 1-N from clock generation circuitry within the JTAG Pattern Engine 113. As mentioned, the CLK 1-N outputs from the JTAG Pattern Engine can be controlled to operate at different frequencies and/or times to adjust how each die coupled to a tester via the test channels is tested.

Figure 3:
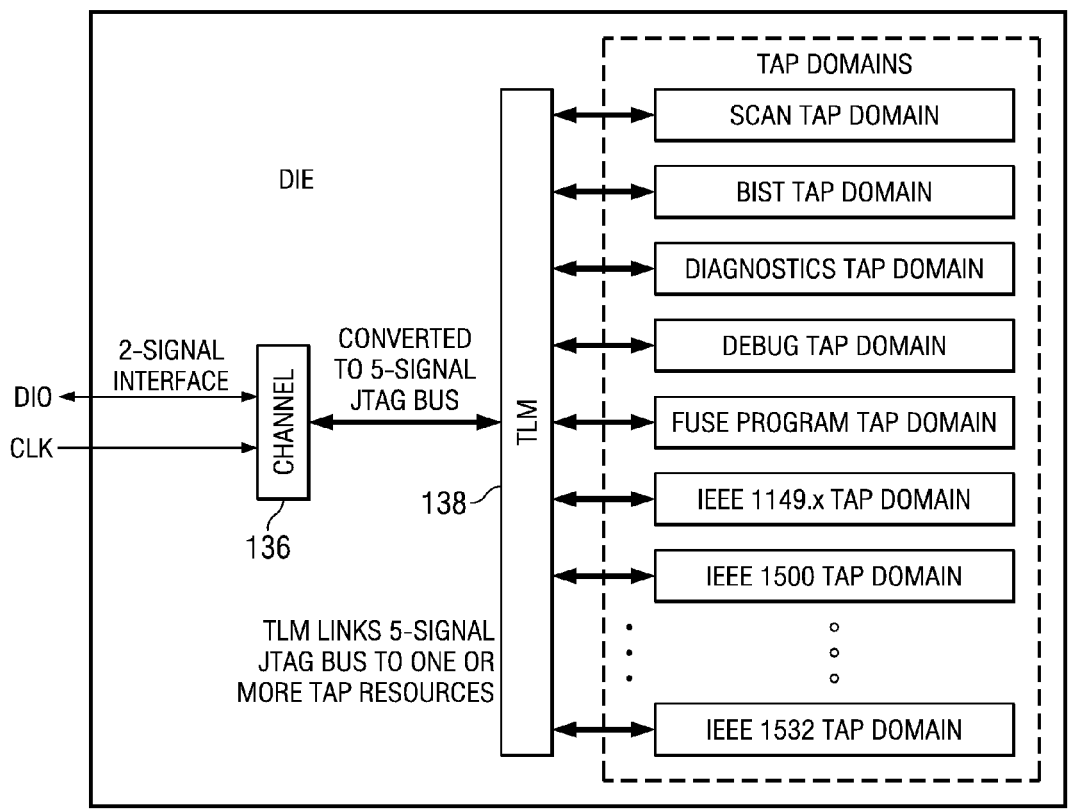
FIG. 3 illustrates an example of a die's test interface channel interfaced to IEEE 1149.1 TAP domains via a Tap Linking Module (TLM) according to the present disclosure.

FIG. 3 illustrates a more detail example of the die 104-110 of FIGS. 1A and 1B. As seen, the die's test channel is coupled to the DIO and CLK signals from a tester's test channel. The die test channel serves to convert the serialized JTAG TMS and TDO patterns on the DIO signal back into conventional parallel JTAG test TMS and TDO patterns and to apply the parallel JTAG TMS and TDI patterns to the TLM. The die test channel also outputs the TCK and TRST signals to the TLM and receives the TDI input from the TLM. The TLM serves to couple one or more of the die TAP domains to the die test channel, via a conventional 5-signal JTAG bus, and then allows the tester to communicate with the coupled TAP domain(s) using the conventional 5-signal JTAG bus. As seen, the TAP domains may be any type of TAP domain including but not limited to; Scan TAP Domains, BIST TAP Domains, Diagnostic TAP Domains, Debug TAP Domains, Fuse Programming TAP Domains, IEEE standard 1149.1, 1149.4, 1149.6, or 1149.7 TAP Domains, IEEE standard 1500 TAP Domains, IEEE standard 1532 TAP Domains, or any other type of domains using a TAP interface.

Figure 4A:
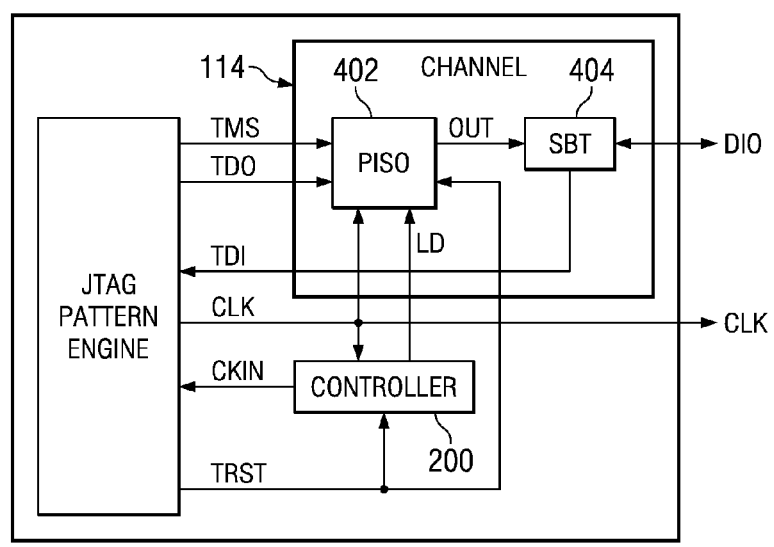
FIG. 4 illustrates an example of the tester's test channel circuitry.
Figure 4B:
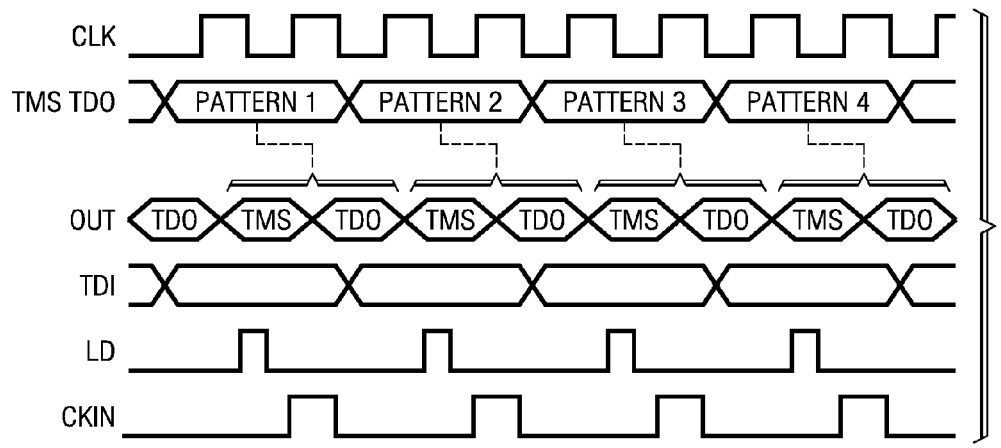
Figure 5A:
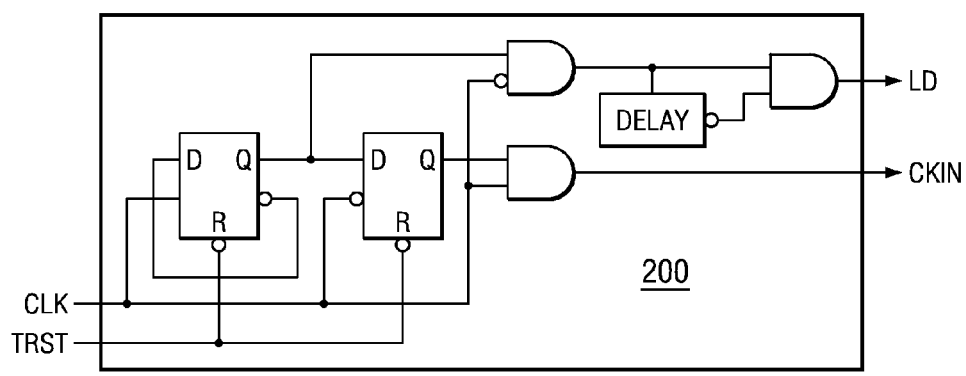
FIG. 5 illustrates an example of the tester's test channel controller circuitry.
Figure 5B:
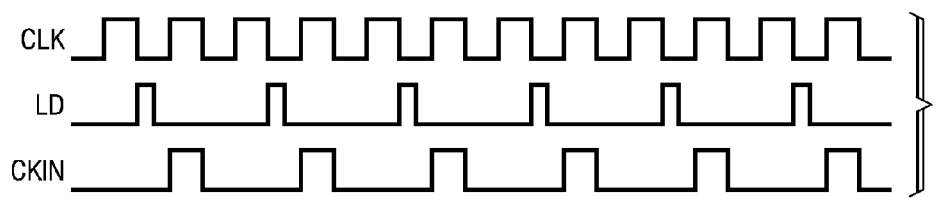

FIG. 4 illustrates a more detail example of the tester's test channel 114 coupled to a controller 200. The test channel consists of a 2-bit parallel input serial output (PISO) register 402 and a simultaneously bidirectional transceiver (SBT) 404. The TRST signal from the JTAG Pattern Engine is used to initialize the controller 200 and test channel's PISO 402. Following initialization, the PISO repeats the steps of loading the TMS and TDO outputs from the JTAG Pattern Engine in response to the LD and CLK signals, then shifting out the TMS and TDO signals serially on DIO in response to the CLK signal. The SBT allows TDI input data from a die test channel, via the DIO signal, to be input to the JTAG Pattern Engine while simultaneously the TMS and TDO data from the JTAG Pattern Engine is being output to the die test channel on DIO. The timing diagram illustrates this simultaneous input and output operation. The SBT is a known interface circuit that allows data to flow simultaneously in both directions over a single connection. A detail description of the operation of the circuit of FIG. 4 is provided in regard to FIGS. 5A and 5B of patent application Pub. No. US 2006/0,236,174. In FIGS. 5A and 5B of patent application Pub. No. US 2006/0,236,174, the SBT circuit is referred to as input/output (I/O) circuit instead of SBT. The operation of the I/O circuit of Pub. No. US 2006/0,236,174 and the SBT circuit of this disclosure is the same.

Figure 6A:
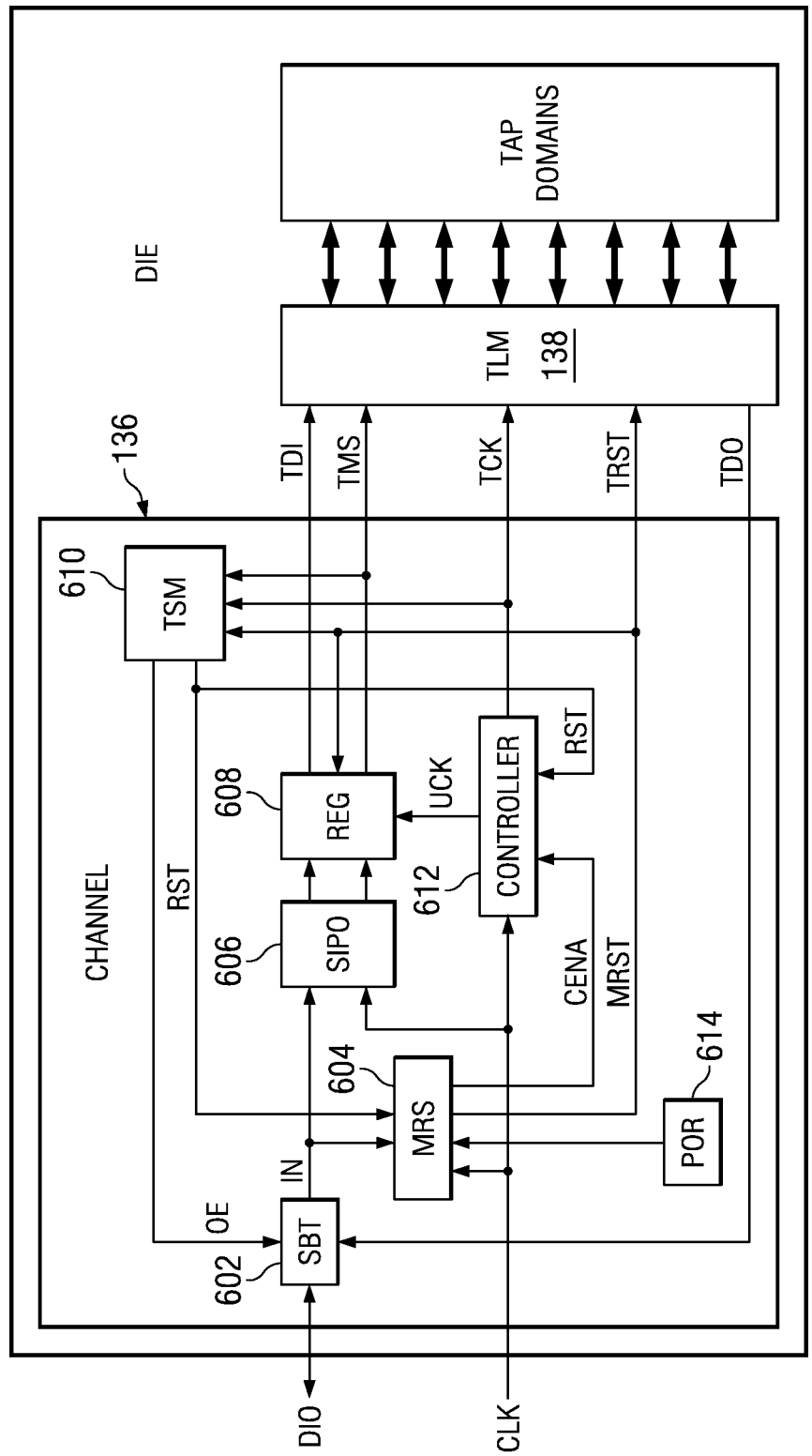
FIG. 6 illustrates an example of a die's test channel circuitry.
Figure 6B:
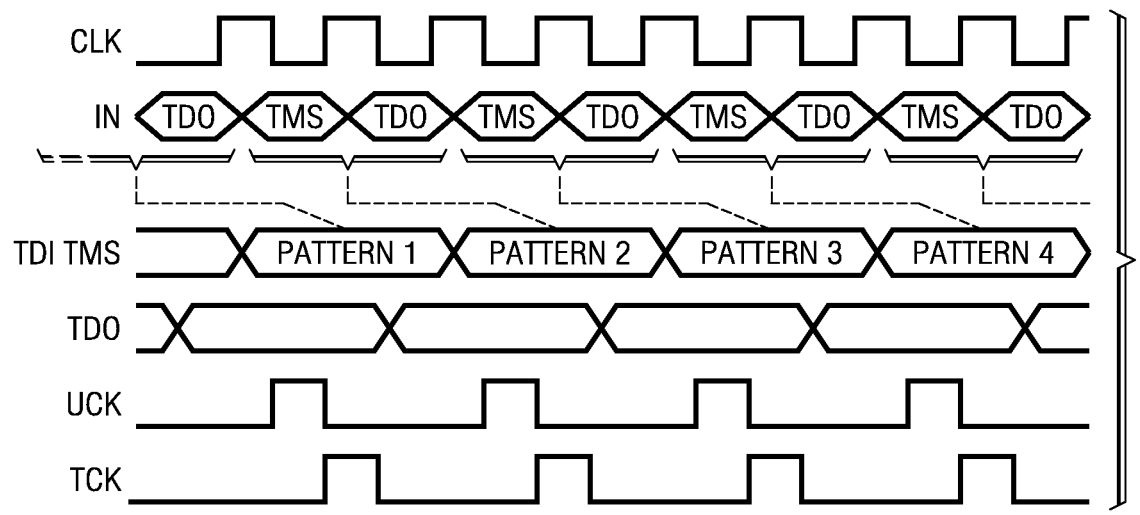

FIG. 5 illustrates an example design of the controller 200 which consists of two flip flops, three AND gates, and a Delay Circuit connected as shown. The TRST signal resets the flip flops, the CLK signal times the flip flops, and the gating and delay circuits decode the states of the flip flops and the CLK input to produce the LD and CKIN output signals. As seen in the timing diagram, the controller responds to the CLK input to repetitively output the LD and CKIN signals. A detail description of the controller 200 is provided in regard to FIGS. 6A and 6B of referenced patent application Pub. No. US 2006/0,236,174.

FIG. 6 illustrates a more detailed example of the die's test channel 136 coupled to a TLM 138. The die test channel 136 consists of an SBT circuit 602, a master reset and synchronization circuit (MRS) 604, a 2-bit serial input parallel output (SIPO) circuit 606, a 2-bit register (REG) circuit 608, a TAP state monitor (TSM) circuit 610, a controller circuit 612, and a power on reset (POR) circuit 614. The SBT circuit is used to input (IN) data from the DIO signal to the MRS and SIPO circuits. The MRS circuit is used to reset the die channel circuitry, TLM, and TAP Domains, and to synchronize the operation of the die channel circuitry with the tester's channel circuitry. The MRS outputs a master reset (MRST) signal, which resets the channel circuitry, TLM, and TAP Domains, whenever the 5 TMS logic ones have been input on DIO and consequently output on the TMS output of the REG.

Clocking, via TCK, the 5 TMS logic ones from the REG into the TSM, which is a TAP state machine, causes the TSM to enter the test logic reset (TRST) state which sets the RST output of the TSM low, resetting the MRS and controller circuit. The TAP of the selected TAP domain(s) also enters the TRST state whenever the TSM enters the TRST state, which resets the TAP domain(s). The reset state on the channel circuitry, TSM, and TAP Domains remains as long as DIO input logic ones on the IN input of the MRS circuit. To transition from the reset state, a synchronization code from the tester, consisting of say 2 logic zeros followed by 2 logic ones, is input to the MRS circuit via DIO. In response to the synchronization code, the MRS sets the CENA signal high for a period of time to enable the operation of the controller to input serialized TMS and TDO patterns into the SIPO to be output as TMS and TDI patterns to the TSM and TLM via the REG. With the controller and SIPO enabled, serialized JTAG TMS and TDI signal from the tester are again output from the REG to cause the TSM to transition from the TRST state, which removes the logic low on the RST output of the TSM and enables the operation of the TLM and selected TAP Domain(s).

The SIPO circuit is used to input, via the IN signal, the serialized TMS and TDO data packets from the SBT circuit and output them in parallel to the REG circuit. The REG circuit is used to hold the parallel TMS and TDI input signals to the TLM circuit stable as the next serialized TMS and TDO input packet is shifted into the SIPO circuit. The controller circuit is used to update TMS and TDI data from the SIPO into the REG, via the update clock (UCK) signal, and to produce a test clock (TCK) signal which times the selected TAP domain(s) via the TLM circuit. The TSM is used to allow the test channel circuitry to track the sixteen TAP states of the connected TAP domain circuit. The POR circuit is used to force the test channel, TLM, and TAP Domains into a reset state when power is first applied to the die. As seen in the timing diagram the die test channel inputs serialized TMS and TDO signals from the DIO signal and converts them into parallel TMS and TDI patterns, via the SIPO and REG, which are input to the TLM. Simultaneous with the inputting of the serialized TMS and TDO signals on DIO, the test channel can output, during TAP IR or DR Shift operations, TDO data on DIO from the TAP Domain(s) selected by the TLM.

Figure 7A:
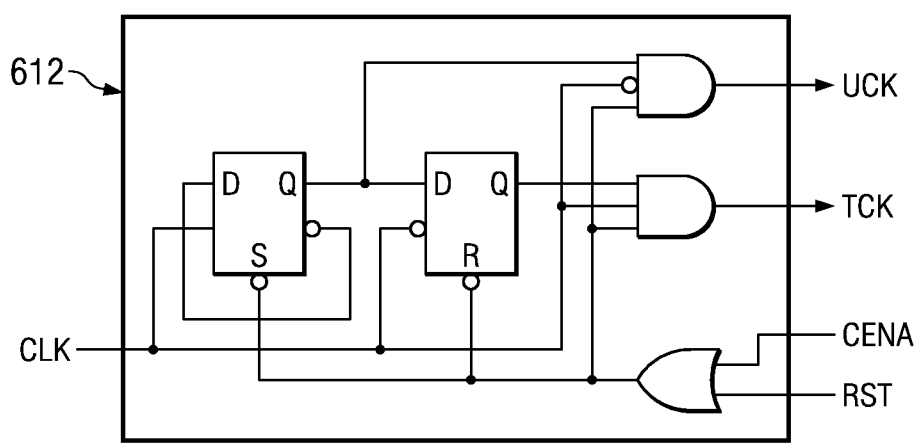
FIG. 7 illustrates an example of the die's test channel controller circuitry.
Figure 7B:
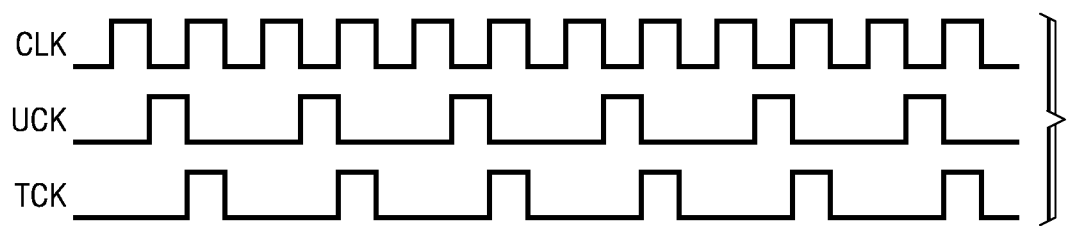

A detailed description of circuitry very similar to the test channel circuitry of FIG. 6 is given in regard to FIGS. 7A, 7B, 8A, 8B, 9A, 9B, and 9C of referenced patent application Pub. No. US 2006/0,236,174. In FIGS. 7A and 7B of patent application Pub. No. US 2006/0,236,174, the SBT circuit is referred to as input/output (I/O) circuit instead of SBT. The operation of the I/O circuit of Pub. No. US 2006/0,236,174 and the SBT circuit of this disclosure is the same. In FIG. 6 of this application the TLM is shown outside the TAP domain block, whereas in FIG. 7A of reference application Pub. No. US 2006/0,236,174 the TLM, if used, is embedded within the TAP domain block and thus not shown.

FIG. 7 illustrates an example design of the controller 612 which consists of two flip flops and two AND gates connected as shown. The flop flops can be reset by either the controller enable (CENA) or reset (RST) signals. The CLK signal times the flip flops and the gating circuits decode the states of the flip flops and the CLK input to produce the update clock (UCK) and TCK output signals. As seen in the timing diagram, the controller responds to the CLK input to repetitively output an update clock (UCK) to the REG and a TCK to the TLM and coupled TAP Domain(s). A detail description of the controller 612 is provided in regard to FIGS. 8A and 8B of referenced patent application Pub. No. US 2006/0,236,174.

Figure 8:
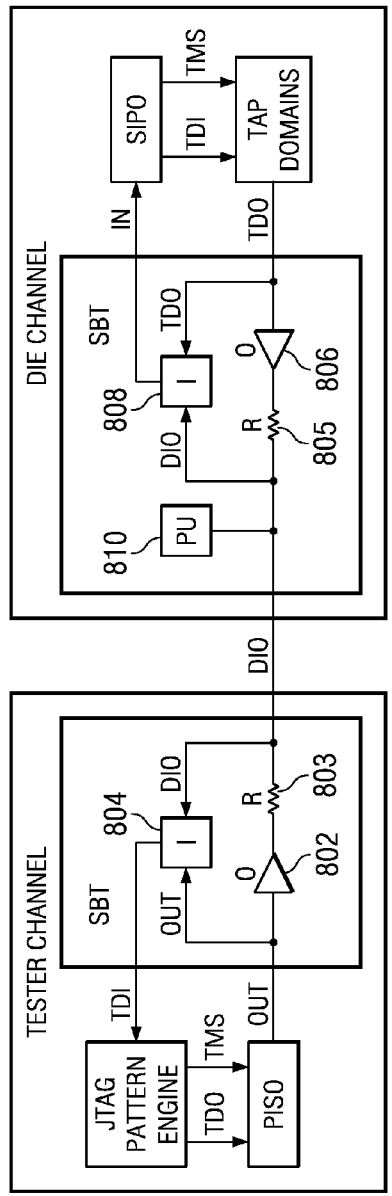
FIG. 8 illustrates an example of the interface between the SBT circuitry of the tester's test channel and the SBT circuitry of a die's test channel.
Figure 9B:
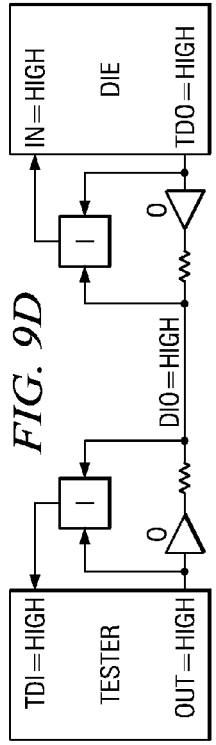
FIG. 9 illustrates the operation of the SBT circuitry.
Figure 9D:
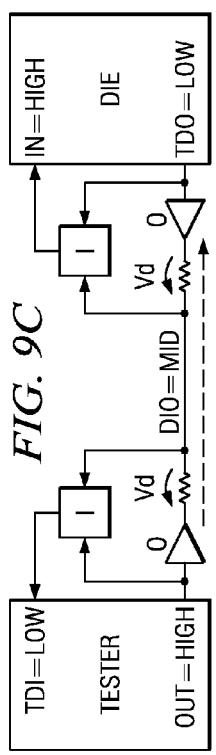
Figure 9A:
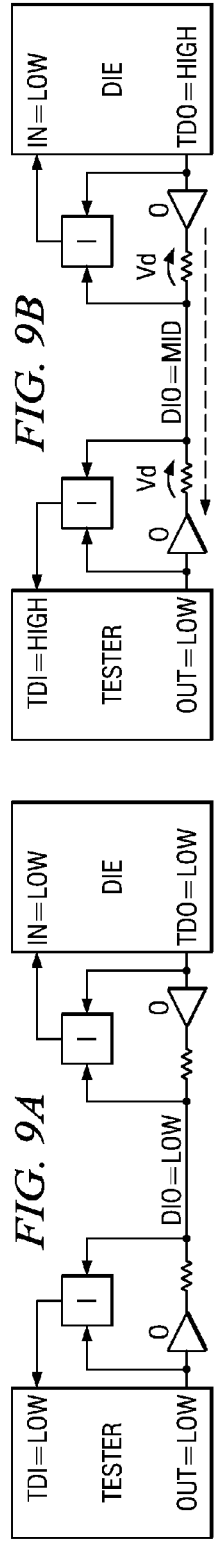
Figure 9C:
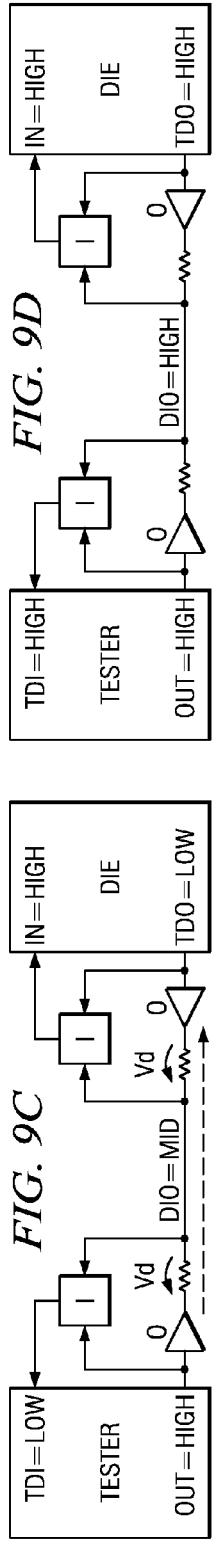

FIG. 8 illustrates the DIO connection between the SBT circuit of the tester's channel and SBT circuit of the die's channel. For simplification, the accompanying CLK signal connection is not shown. The tester channel's SBT circuit consists of an output buffer 802, a resistor 803, and an input (I) circuit 804. The die channel's SBT circuit includes an output buffer 806, a resistor 805, an input (I) circuit 808, and a pull up (PU) element 810. PU element 810 is used to hold the DIO input to the die channel high whenever the DIO input is not being externally driven, which forces the die's test channel, TLM, and TAP Domain circuits into a reset state, as previously described in regard to FIG. 6.

For simplification, the REG and the TLM circuits are not shown between the SIPO and TAP Domains. The output buffers 802 and 806 serve to output data onto the DIO path from the tester and die channels respectively. The resistors 803 and 805 of the SBT circuits serve to limit current flow when the tester and die channels are outputting opposite logic states. The input (I) circuit compares the voltage level on the DIO path to the logic voltage level being output from the tester and die channel. If the voltage level on DIO is the same as the logic voltage level being output from the tester and die channel, the input (I) circuit inputs that voltage level to the TDI input of the JTAG Pattern Engine of the tester channel and to the IN input of the SIPO of the die channel. If the voltage level on DIO is at a mid-point level, indicating the output buffers 802 and 806 are outputting opposite logic voltage levels, the JTAG Pattern Engine will input the opposite logic level being output from output buffer 802 and the SIPO will input the opposite logic level being output from output buffer 806.

The simultaneous bidirectional data operation of the SBT circuits are described in case statements A-D of FIG. 8 and illustrated in FIG. 9. A detail description of the operation of the SBT circuits is provided in regard to FIGS. 11A, 11B, 12, and 13 of referenced patent application Pub. No. US 2006/0, 236,174.

Figure 10A:
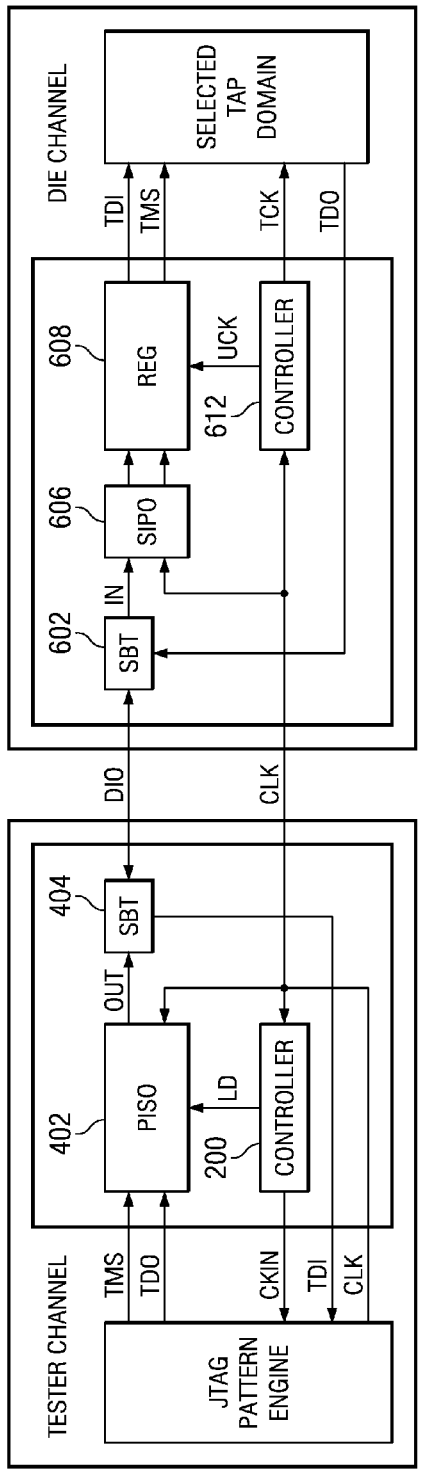
FIG. 10 illustrates an example of the 2-signal interface between the tester's test channel and a die's test channel.
Figure 10B:
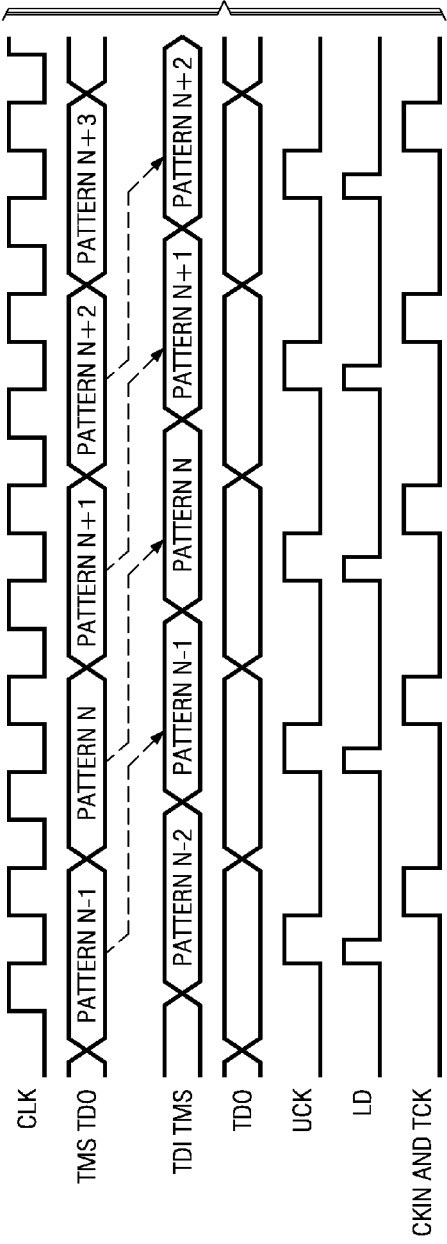

FIG. 10 illustrates the DIO and CLK connections between a tester channel and a die channel. For simplification, the die channel circuit only shows the SBT 602, SIPO 606, REG 608, and Controller 612 circuits and their associated signals, with the exception of the TRST signal. Also the TLM circuit 138 is not shown between the die channel and selected TAP Domain(s). It should be noted that in instances where there is only one TAP domain in the die, the TLM circuit will not be required at all since that TAP domain will be permanently coupled to the die channel as shown in FIG. 10.

The operation of the channels is shown in the timing diagram. As seen in the timing diagram, the operation includes repetitively serializing TMS and TDO output patterns from the JTAG Pattern Engine over the DIO path using the PISO 402, then de-serializing the TMS and TDO signals into parallel TMS and TDI inputs to the selected TAP Domain(s) using the SIPO 606 and REG 608. During the serialize and de-serialize operations, controller 200 outputs the LD signal to the PISO to load the TMS and TDO pattern from the JTAG Pattern Engine and outputs the CKIN signal to time the operation of JTAG control circuitry within the JTAG Pattern Engine while, concurrently, controller 612 outputs the UCK signal to update the REG with the parallel TMS and TDI signals from the SIPO and outputs the TCK signal to time the operation of the TAP Domain. A more detail description of this serialize and de-serialize operation is provided in regard to FIGS. 14A, 14B, and 14C of referenced patent application Pub. No. US 2006/0,236,174.

Figure 11:
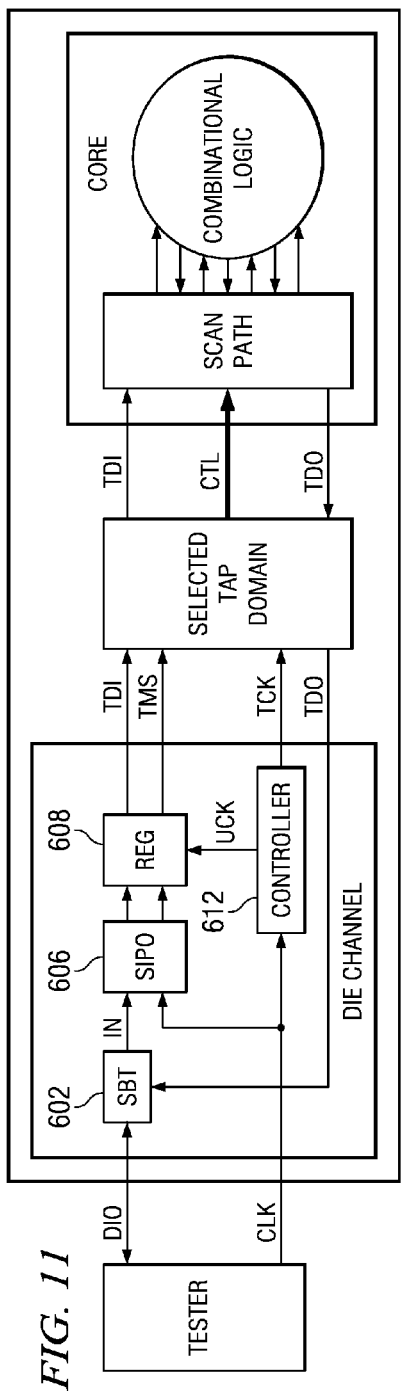
FIG. 11 illustrates an example of performing scan testing using the die test channel.

FIG. 11 illustrates a first example use of the present disclosure to perform scan testing of combinational logic within a core of an IC. In this example, a scan path is accessed by the die channel to shift in stimulus test data, apply the stimulus data to combinational logic, capture the response of the combinational logic into the scan path, and shift the response data out of the scan path to the tester. The use of a scan path to test combinational logic is known. What is new is the use of the die channel to provide the stimulus test data input to the scan path and the response test data output from the scan path.

Figure 12:
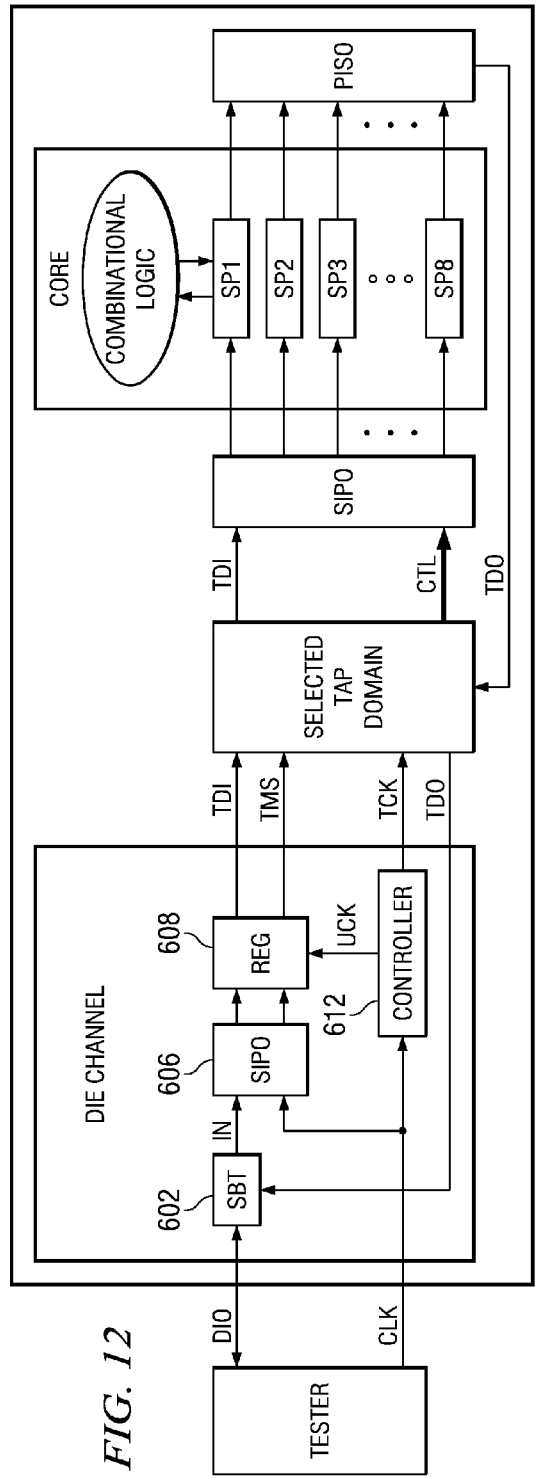
FIG. 12 illustrates an example of performing parallel scan testing using the die test channel.

FIG. 12 illustrates a second example use of the present disclosure to perform scan testing of combinational logic within a core of an IC. In this example, a SIPO register is used to serially input and apply stimulus test data to inputs of parallel scan paths and a PISO register is used to capture and shift out response test data from the outputs of the parallel scan paths. The use of a SIPO and a PISO to input and output test data to parallel scan paths is known, see U.S. Pat. No. 6,242,269. What is new is the use of the die channel to provide the stimulus test data input to the SIPO and the response test data output from PISO.

Figure 13:
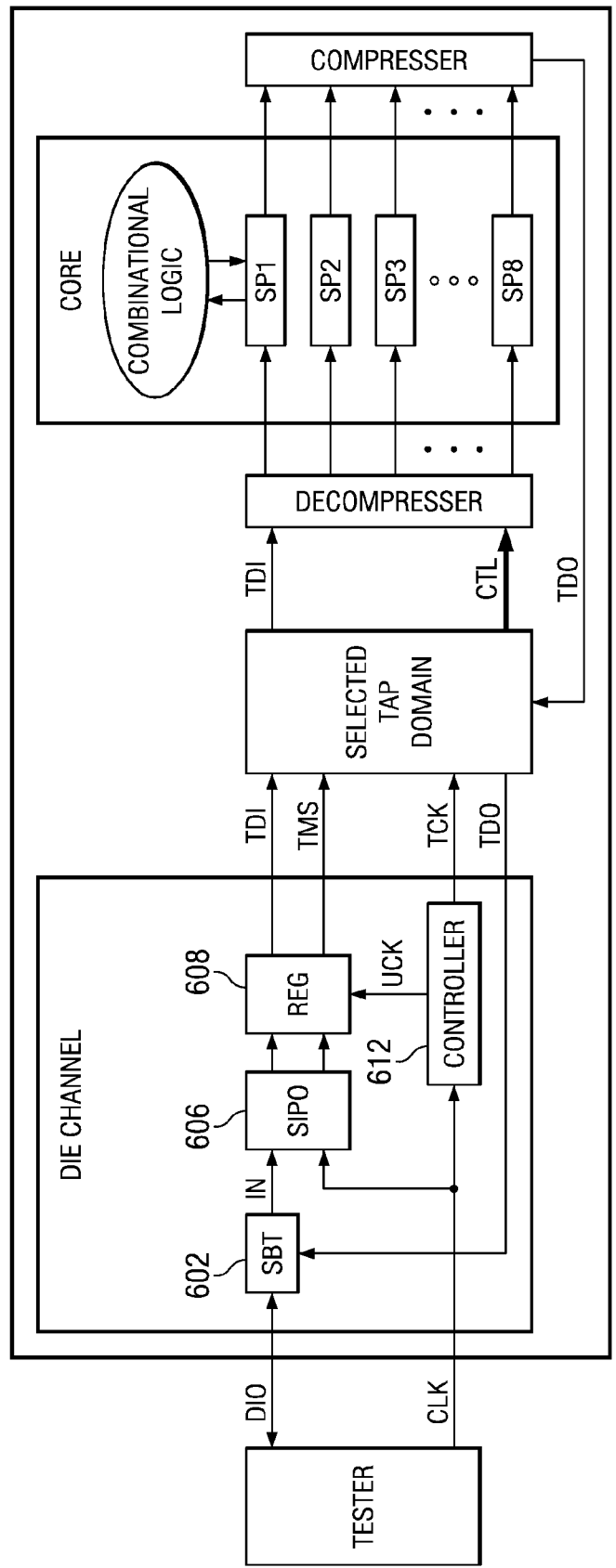
FIG. 13 illustrates an example of performing test data decompression/compression testing using the die test channel.

FIG. 13 illustrates a third example use of the present disclosure to perform scan testing of combinational logic within a core of an IC using decompression and compression circuits. In this example, a decompresser circuit is loaded with compressed stimulus test data patterns from TDI which are decompressed by the decompresser and input to the parallel scan paths, while the compresser circuit compresses the output responses of the parallel scan paths and outputs the compressed response test data to the tester. The use of test data compression and decompression circuits is known, see U.S. Pat. No. 6,543,020. What is new is the use of the die channel to provide the compressed stimulus data input to the decompresser and the compressed response data output from the compresser.

Although exemplary embodiments of the present disclosure are described above, this does not limit the scope of the present disclosure, which can be practiced in a variety of embodiments. Further, references to detailed descriptions in referenced patent Pub. No. US 2006/0,236,174 are intended to provide more detailed teaching of the operation of circuits similar to those described in this application. It should be understood that subtle differences in circuit and signal names may be seen between the circuitry described in Pub. No. US 2006/0,236,174 and the circuitry contained in this application.

What is claimed is:

1. An integrated circuit die, comprising:
    A. channel circuitry having a channel interface that includes:
        i. a bidirectional data input/output path for a test mode select signal, a test data in signal, and a test data out signal,
        ii. a clock input lead, and
        iii. a linking module interface that includes a test mode select output lead, a test data in output lead, a test data out input lead, and a test clock output lead;
    B. TAP domains, each TAP domain being connected to combinational logic and having a TAP interface that includes a test mode select input, a test data input, a test clock input, and a test data output; and
    C. TAP linking module circuitry having a first interface connected to the linking module interface of the channel circuitry and second interfaces, each second interface being connected to the TAP interface of a TAP domain.

2. The die of claim 1 in which the first interface of the TAP linking module includes a test mode select input lead connected to the test mode select output lead, a test data in input lead connected to the test data in output lead, a test data out output lead connected to the test data out input lead, and a test clock input lead connected to the test clock output lead.

3. The die of claim 1 in which each second interface includes a test mode select output connected to a test mode select input, a test data in output connected to a test data input, a test clock output connected to a test clock input, and a test data out input connected to a test data output.

* * * * *